US008186200B1

(12) United States Patent
Hixon

(10) Patent No.: US 8,186,200 B1
(45) Date of Patent: May 29, 2012

(54) TIMEKEEPER DISPLAY SYSTEMS AND METHODS

(75) Inventor: William K. Hixon, Boise, ID (US)

(73) Assignee: William K. Hixon, Boise, ID (US)

( * ) Notice: Subject to any disclaimer, the term of this patent is extended or adjusted under 35 U.S.C. 154(b) by 0 days.

(21) Appl. No.: 13/025,027

(22) Filed: Feb. 10, 2011

Related U.S. Application Data

(60) Provisional application No. 61/427,674, filed on Dec. 28, 2010.

(51) Int. Cl.
*G01R 13/30* (2006.01)

(52) U.S. Cl. ........................................................ 73/1.43

(58) Field of Classification Search ........................ None
See application file for complete search history.

(56) References Cited

U.S. PATENT DOCUMENTS

| | | | | |
|---|---|---|---|---|
| 1,918,965 | A | 7/1933 | Gustafson | |
| 2,058,616 | A | 10/1936 | Norrman | |
| 2,064,559 | A | 12/1936 | Norrman | |
| 2,380,360 | A | 7/1945 | Bennett | |
| 2,394,746 | A | 2/1946 | Burgbacher | |
| 2,465,013 | A * | 3/1949 | Epstein | 434/386 |
| 2,784,586 | A | 3/1957 | Campbell, Sr. et al. | |
| 5,886,954 | A * | 3/1999 | Asami et al. | 368/67 |
| 2005/0105410 | A1 | 5/2005 | Kitano et al. | |
| 2009/0129208 | A1 | 5/2009 | Weiss | |

* cited by examiner

*Primary Examiner* — Robert R Raevis
(74) *Attorney, Agent, or Firm* — Kilpatrick Townsend & Stockton LLP

(57) ABSTRACT

Systems and methods establish a way by which a retail store customer can verify the accuracy of a timekeeping product. A reference timekeeping product can be displayed in a retail store display along with a timekeeping product that has been synchronized at a known time-of-day with the reference timekeeping product. The retail store customer can then visually identify a discrepancy or lack thereof between a displayed product time-of-day of the timekeeping product, and a displayed standard time-of-day of the reference clock.

20 Claims, 7 Drawing Sheets

TIMEKEEPER DISPLAY SYSTEMS AND METHODS

CROSS-REFERENCE TO RELATED APPLICATION

This application is a nonprovisional of, and claims the benefit of the filing date of, U.S. Provisional Patent Application No. 61,427,674, entitled "TIMEKEEPER DISPLAY SYSTEMS AND METHODS", filed Dec. 28, 2010, the entire disclosure of which is incorporated herein by reference for all purposes.

BACKGROUND OF THE INVENTION

Embodiments of the present invention relate to systems and methods for displaying timekeeping products, and in particular to a retail store display that allows a customer to visually determine the accuracy of a timekeeping product.

Retail store displays of timekeeping products allow a customer to identify and appreciate a variety of characteristics of individual timepieces. Such displays can help to increase brand recognition, convey product value, and provide useful information to customers during a shopping experience. Although currently available retail store displays provide real benefits to both retail merchants and customers alike, many advances may still be made to provide improved display systems and methods for displaying timekeeping products. Embodiments of the present invention provide a solution for at least some of these needs.

BRIEF SUMMARY OF THE INVENTION

Embodiments of the present invention encompass retail store display systems and methods for displaying timekeeping products that allow a retail customer to visually determine the accuracy of a timekeeping product. Such retail store displays can advantageously allow a customer to quickly verify the accuracy of a particular timepiece, or a multitude of timekeeping products simultaneously, and provide information that a customer can utilize in making a purchasing decision relative to a particular timekeeping product. Hence, a customer may ask a salesperson questions relating to the accuracy of the timekeeping product, and the customer can verify statements made at the point of sale. This information can be of great importance as many mechanical timekeeping products can portray unsatisfactory accuracy, and display time-of-day information with errors of up to seconds or more per day.

An exemplary display method can include the steps of synchronizing a timekeeping product with a reference clock at a known time-of-day, displaying within the retail store display the known time-of-day at which the timekeeping product was synchronized with the reference clock, and placing the synchronized timekeeping product and the continuously calibrated reference clock within the retail store display so that a retail customer can visually identify a discrepancy or a lack thereof between a product time-of-day displayed by the synchronized timekeeping product and a standard time-of-day displayed by the reference clock. The method may also include the steps of receiving at the retail store a reference time signal that has been broadcast from a national measurement standards laboratory, and using the reference time signal to continuously calibrate the reference clock so that the reference clock displays a standard time-of-day as maintained by the national measurement standards laboratory. This system can increase customer satisfaction by providing objective data by which a customer can determine the accuracy of a timekeeping product prior to purchase. Such a reaction can improve customer loyalty by limiting buyer's regret and possible feelings of animosity towards the store and salespeople based on a perceived duplicity in sales tactics, because a customer can recognize the accuracy of a timepiece independent of any salesperson interaction.

In accordance with one aspect of the invention, a method for displaying a timekeeping product in a retail store display may include the steps of a) receiving, at a retail store, a reference time signal broadcast from a national measurement standards laboratory; b) continuously calibrating, at the retail store, a reference clock using the reference time signal, so that the reference clock displays a standard time-of-day as maintained by the national measurement standards laboratory; c) synchronizing, at a known time-of-day, the timekeeping product with the reference clock; d) displaying, within the retail store display, the known time-of-day at which the timekeeping product was synchronized with the reference clock; and e) placing the synchronized timekeeping product, and the continuously calibrated reference clock, within the retail store display so that a product time-of-day displayed by the synchronized timekeeping product, and the standard time-of-day displayed by the reference clock, are visible to a retail customer at the retail store in a way by which the retail customer can visually identify a discrepancy or a lack thereof between the displayed product time-of-day of the timekeeping product and the displayed standard time-of-day of the reference clock.

In another aspect, embodiments of the present invention include methods for displaying a timekeeping product in a retail store display. Such methods may include, for example, synchronizing the timekeeping product with a reference timekeeping product at a known time and date, wherein the reference timekeeping product is continuously calibrated to a time and frequency standard that is received via a transmission. Methods may also include incorporating the synchronized timekeeping product into the retail store display. Methods may still further include identifying, within the retail store display, the known time and date on which the timekeeping product was synchronized with the reference timekeeping product. Methods may yet still include, in some aspects, locating the reference timekeeping product near the retail store display so that a retail store customer can visually identify a discrepancy in timekeeping accuracy between the timekeeping product and the reference timekeeping product. In some cases, the timekeeping product may be an analog timekeeping device, a digital timekeeping device, a battery-powered timekeeping device, a manually-winding-type timekeeping device, an automatically-powered timekeeping device, or a timekeeping device that is powered by a combination of automatic power and battery power. In some aspects, the timekeeping product can be a kinetic-powered or motion-powered timekeeping device, a solar-powered timekeeping device, or a thermo-electrically-powered timekeeping device. In still other cases, the timekeeping product may be a kinetic-powered timekeeping device that includes a kinetic-powered winding mechanism, and the retail store display may include a maneuvering mechanism to which the kinetic-powered timekeeping device is coupled such that the movement of the maneuvering mechanism operates to wind the kinetic-powered winding mechanism. In some aspects, the maneuvering mechanism can be, for example, a rotating pedestal.

In another aspect, embodiments of the present invention may relate to a method for displaying in a retail store display a timekeeping product that has been synchronized with a reference timekeeping product. The method may include calibrating the reference timekeeping product via a signal received from a broadcast from a national measurement standards laboratory. The methods may include synchronizing the timekeeping product with a reference clock at a known time-of-day, and displaying the known time-of-day, or date and time, within the retail store display. In some cases, the retail store display can also include, in the same location as the displayed known time-of-day, an indication of a winding time-of-day at which a manually-winding-type timekeeping device was wound.

In some aspects, embodiments of the present invention encompass a method for displaying in a retail store display a timekeeping product that includes a solar conversion panel and energy cell. The method may also include, for example, including a lighting mechanism within the retail store display such that the solar conversion panel is exposed to light from the lighting mechanism so as to charge the energy cell of the timekeeping product.

In accordance with yet another aspect, embodiments of the present invention encompass a method for displaying within a retail store display an automatically-powered timekeeping device that is a thermo-electrically-powered timekeeping device. The thermo-electrically-powered timekeeping device may include, in some cases, an endothermic plate, a thermo-electric conversion mechanism, and an energy cell. The retail store display may include a heating mechanism, and, in some aspects, the thermo-electrically-powered timekeeping device is positioned in the retail store display such that the endothermic plate is exposed to heat from the heating mechanism so as to charge the energy cell of the thermo-electrically-powered timekeeping device with electricity produced by the thermo-electric conversion mechanism.

In still another aspect, embodiments of the present invention include methods for displaying a reference timekeeping product in a retail store display where the reference product is calibrated to a timekeeping standard received from a broadcasted signal. The methods may also include, for example, using the reference timekeeping product to synchronize a timekeeping product. The methods may also include displaying the timekeeping product in the retail store display with the reference timekeeping product so that a retail customer can visually compare time kept by the timekeeping product against time displayed by the reference timekeeping product. In some cases, the retail store display is constructed to allow a transmission of a reference time signal to be received by the reference timekeeping product for calibration purposes.

Additional embodiments and features are set forth in part in the ensuing detailed description and accompanying drawings, and in part will become apparent to those skilled in the art upon examination of the specification, or may be learned by the practice of the invention. The features and advantages of the invention may be realized and attained by means of the instrumentalities, combinations, and methods described in the specification.

DETAILED DESCRIPTION OF THE INVENTION

Watches, clocks, timepieces, and timekeeping products present a variety of different forms that all affect the ability of the particular timekeeping product to maintain the accuracy of its timekeeping function. For example, whether a timekeeping product maintains its accuracy by use of the piezoelectric effect in a quartz crystal or by use of a wound mainspring can affect the accuracy of timekeeping by as much as seconds or more per day. Timekeeping products can be both analog and digital, and are powered by a variety of mechanisms. Examples of the ways in which timekeeping products are powered include battery-powered, manually-winding-type power, and automatically-powered timekeeping devices. Automatically-powered timekeeping devices can be powered in many different ways, and examples of such different ways include, kinetic or motion power, solar power, or thermo-electric power.

Embodiments of the present invention encompass methods for displaying a timekeeping product in a retail store display. Such retail displays can advantageously allow a customer to quickly verify the accuracy of a particular timepiece, or a multitude of timekeeping products simultaneously, and provide information that a customer can utilize in making a purchasing decision relative to a particular timekeeping product. An exemplary method can include the steps of receiving, at a retail store, a reference time signal that has been broadcast from a national measurement standards laboratory; continuously calibrating, at the retail store, a reference clock using the reference time signal, so that the reference clock displays a standard time-of-day as maintained by the national measurement standards laboratory; synchronizing a timekeeping product with the reference clock at a known time-of-day; displaying within the retail store display the known time-of-day at which the timekeeping product was synchronized with the reference clock; and placing the synchronized timekeeping product and the reference clock within the retail store display so that a retail customer can visually identify a discrepancy or a lack thereof between a product time-of-day displayed by the synchronized timekeeping product and the standard time-of-day displayed by the reference clock.

Figure 1:
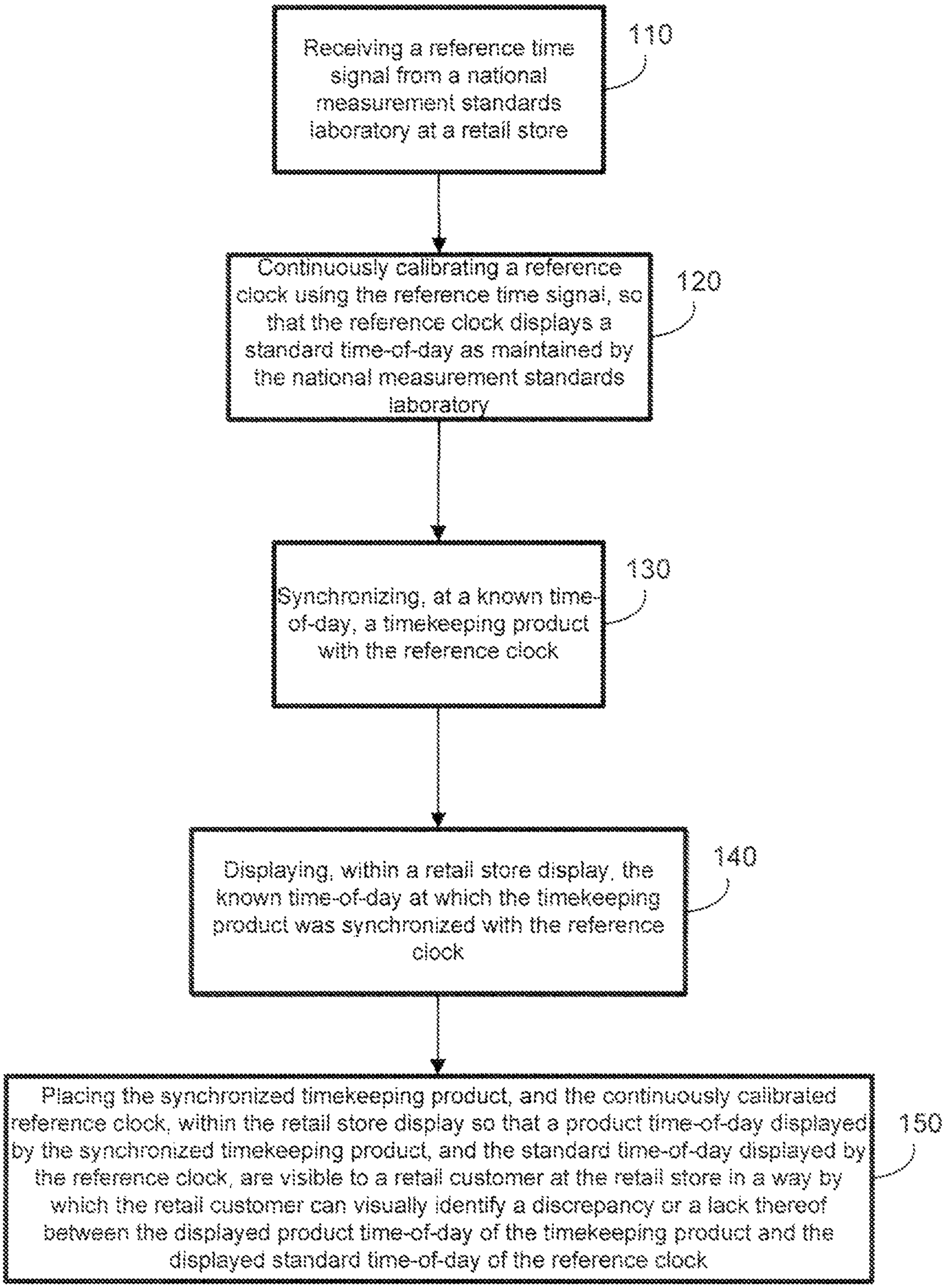
FIG. 1 is a flowchart illustrating a method for displaying a timekeeping product in a retail store display according to embodiments of the present invention.

Turning to the drawings, FIG. 1 is a flowchart illustrating a method for displaying a timekeeping product in a retail store display according to embodiments of the present invention. A reference time signal is received 110 at a retail store from a national measurement standards laboratory. Once received, a reference clock uses the reference time signal to continuously calibrate 120 the reference clock to the time signal, so that the reference clock displays a standard time-of-day as maintained by the national measurement standards laboratory. After the reference clock is calibrated, it is used to synchronize 130, at a known time-of-day, a timekeeping product, and the known time-of-day is displayed 140 within the retail store display. Both the synchronized timekeeping product, and the continuously calibrated reference clock, are placed 150 within the retail store display. The synchronized timekeeping product, and the continuously calibrated reference clock, are placed 150 within the retail display such that a product time-of-day displayed by the synchronized timekeeping product, and the standard time-of-day displayed by the reference clock are visible to a retail customer at the retail store display. The retail customer can thereby visually identify a discrepancy, or a lack thereof, between the displayed product time-of-day of the timekeeping product, and the displayed standard time-of-day of the reference clock.

Figure 2:
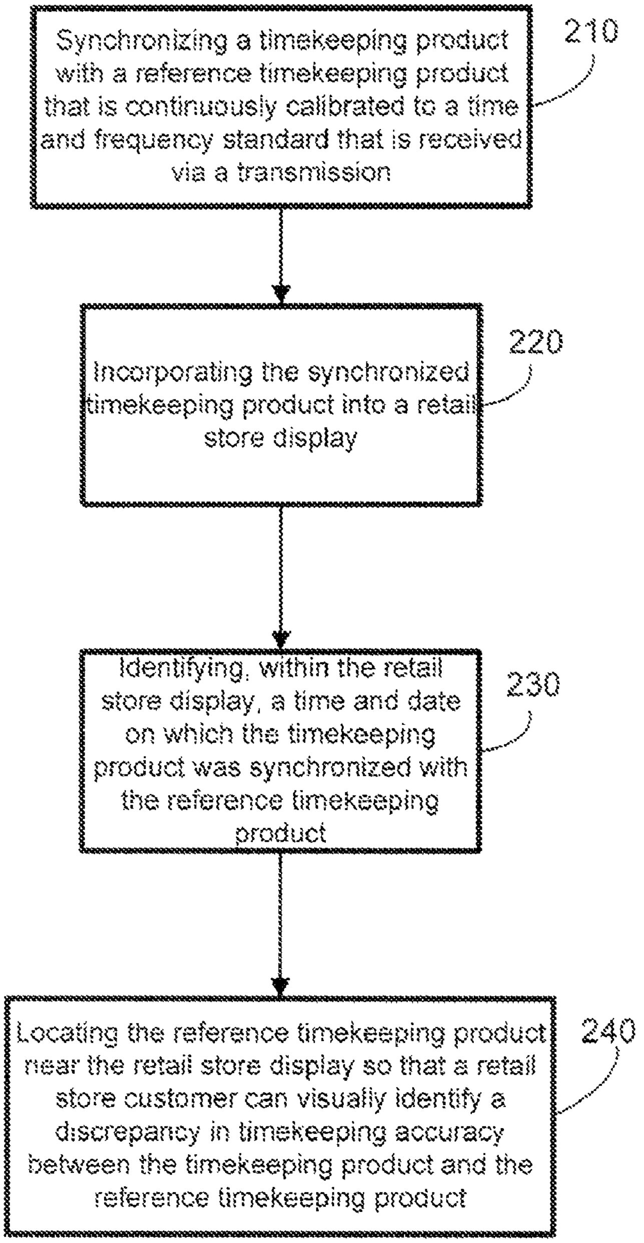
FIG. 2 is a flowchart illustrating a method for incorporating a synchronized timekeeping product into a retail store display according to embodiments of the present invention.

FIG. 2 is a flowchart that illustrates a method for incorporating a synchronized timekeeping product into a retail store display according to embodiments of the present invention. A timekeeping product can be synchronized 210 with a reference timekeeping product that is continuously calibrated to a time and frequency standard that is received via a transmission. Additionally, the synchronized timekeeping product can be incorporated 220 into the retail store display. The method may also include identifying 230, within the retail store display, a time and date on which the timekeeping product was synchronized with the calibrated reference timekeeping product. The method may still include the step of locating 240 the reference timekeeping product near the retail store display so that a retail store customer can visually identify a discrepancy in timekeeping accuracy between the timekeeping product and the reference timekeeping product.

Figure 3:
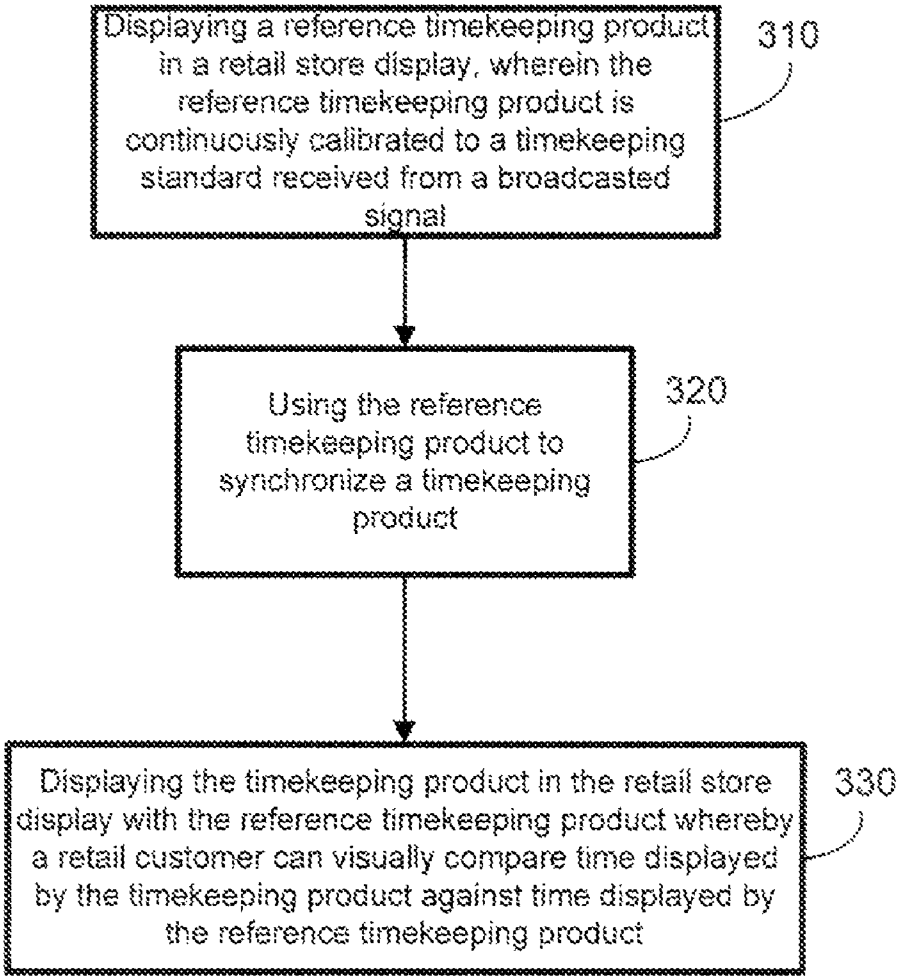
FIG. 3 is a flowchart illustrating a method for displaying a timekeeping product along with a reference timekeeping product in a retail store display according to embodiments of the present invention.

FIG. 3 is a flowchart illustrating a method for displaying a timekeeping product along with a reference timekeeping product in a retail store display according to embodiments of the present invention. The reference timekeeping product can be displayed 310 in the retail store display, where the reference timekeeping product can be continuously calibrated to a timekeeping standard received from a broadcasted signal. The reference timekeeping product can additionally be used 320 to synchronize a timekeeping product. The method may also include the step of displaying 330 the timekeeping product in the retail store display with the reference timekeeping product whereby a retail customer can visually compare time displayed by the timekeeping product against time displayed by the reference timekeeping product.

Figure 4A:
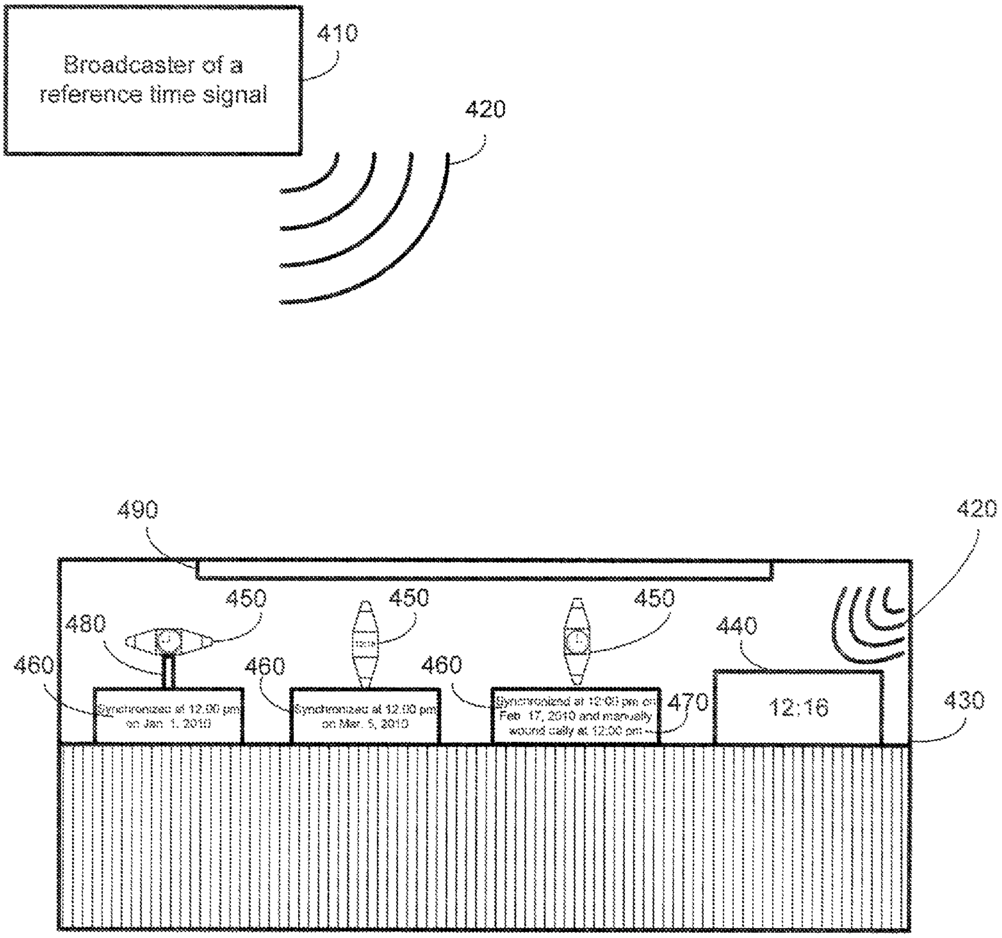
FIGS. 4A-4C illustrate a retail store display for displaying a timekeeping product according to embodiments of the present invention.
Figure 4B:
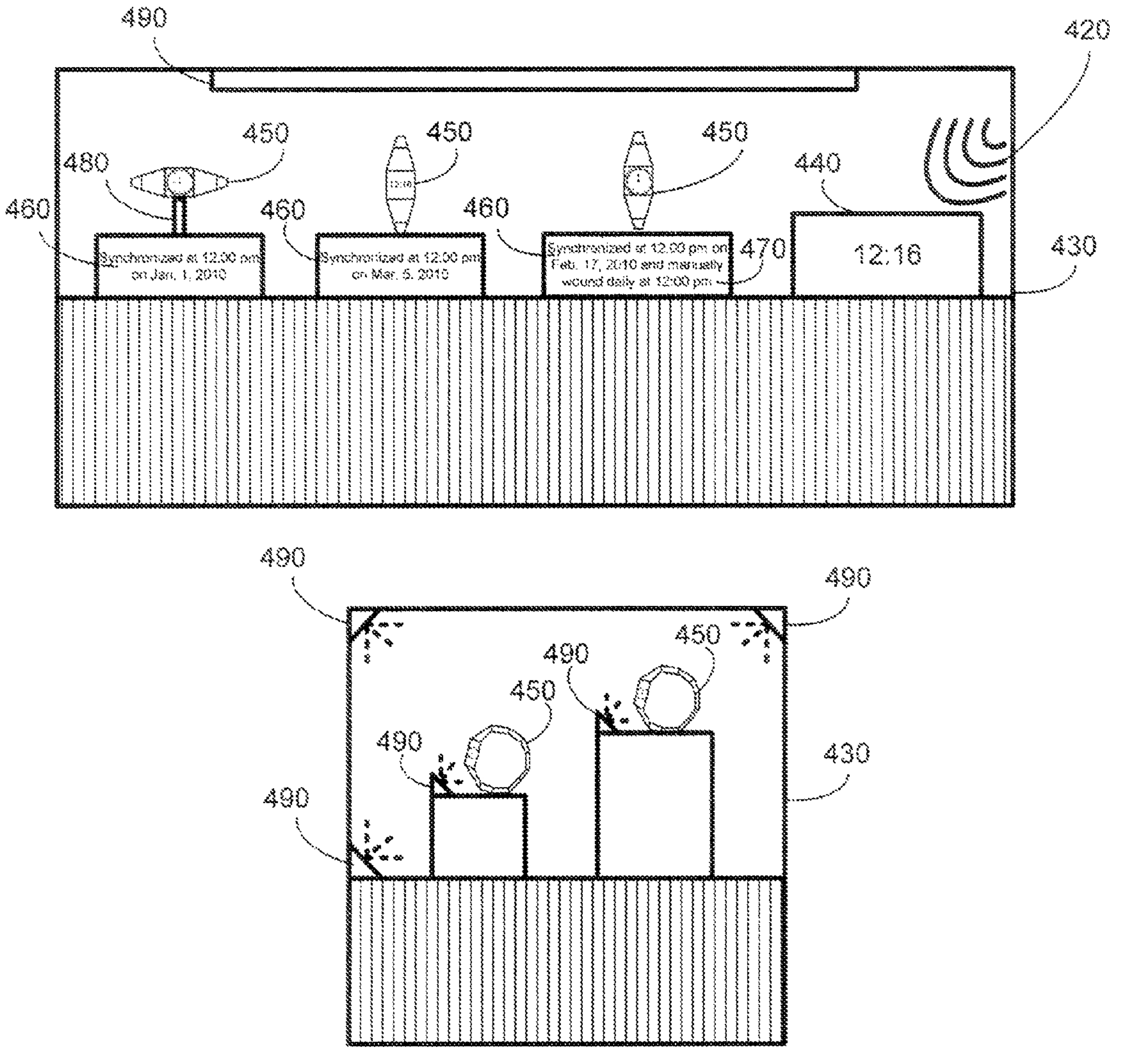
Figure 4C:
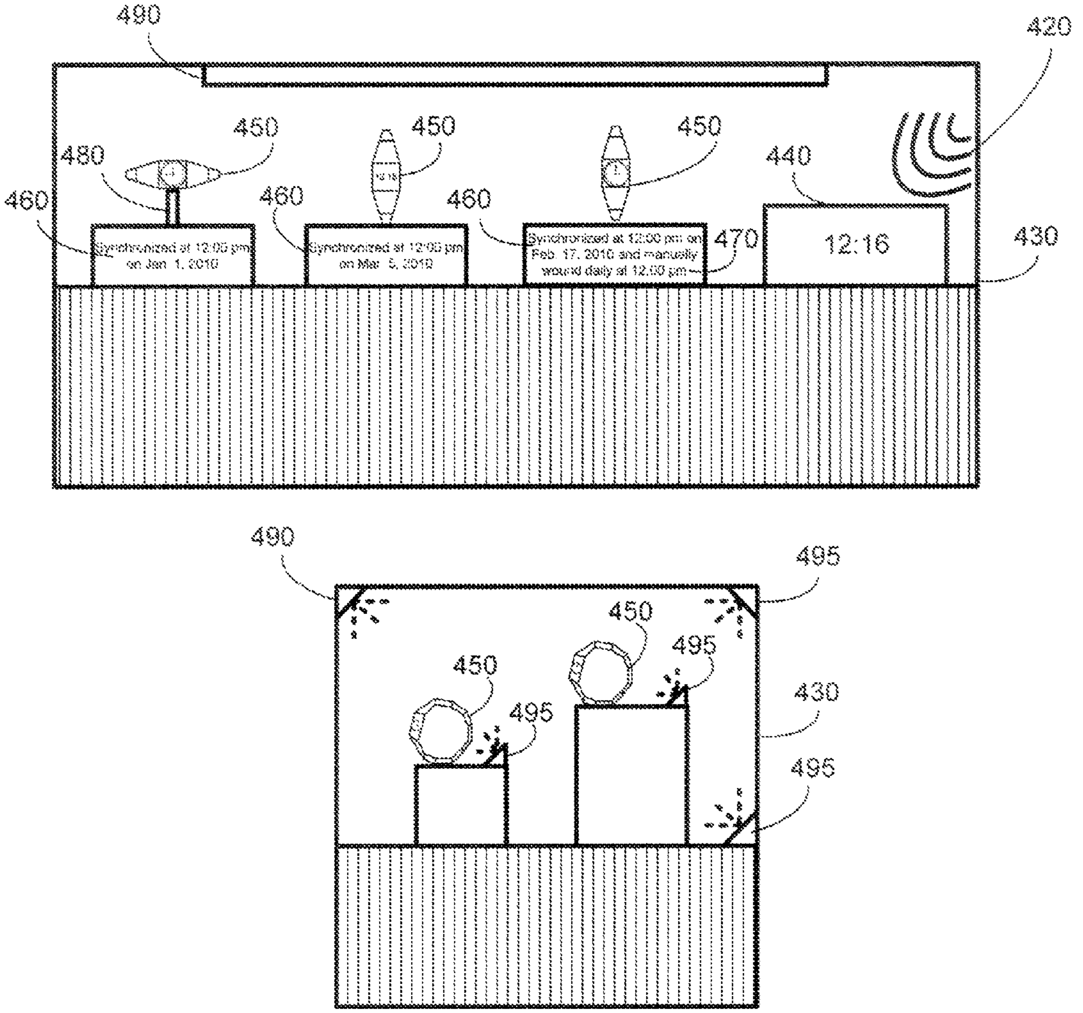

FIGS. 4A-4C illustrate a retail store display for displaying a timekeeping product according to embodiments of the present invention. A reference time signal 420 can be broadcast by an entity 410 to be received by a reference timekeeping product 440. The reference timekeeping product 440 can use the reference time signal 420, for example, for continuous calibration in order to display a standard time-of-day as maintained by the entity 410. A timekeeping product 450 can be synchronized with the reference timekeeping product 440 at a known time-of-day in order to create, in some embodiments, a reference point for determining accuracy of timekeeping function based on a displayed product time-of-day on the timekeeping product. The known time-of-day at which the timekeeping product was synchronized with the reference clock can be displayed 460 within a retail store display 430. The synchronized timekeeping product 450 and the continuously calibrated reference clock 440 can be placed within the retail store display 430. The placement can be made, for example, so that the product time-of-day displayed by the synchronized timekeeping product 450, and the standard time-of-day displayed by the reference clock 440, are visible to a retail customer at the retail store in a way by which the retail customer can visually identify a discrepancy or a lack thereof between the displayed product time-of-day of the timekeeping product 450 and the displayed standard time-of-day of the reference clock 440.

As shown in FIG. 4A, the timekeeping product 450 can be, for example, a mechanical timekeeping device, an electronic timekeeping device, an analog timekeeping device, or a digital timekeeping device. Additionally, the timekeeping product 450 can be, in some aspects, a battery-powered timekeeping device, a manually-winding-type timekeeping device, a radio-controlled timekeeping device, or an automatically-powered timekeeping device.

As shown in FIG. 4A, the entity 410 transmitting the reference time signal 420 can be, for example, a national measurement standards laboratory, or some similar type of organization that maintains some type of atom-based time measurement system. The atom-based time measurement system can be, in some aspects, based on either microwave or optical transitions, and can include femtosecond frequency combs, optical lattices, quantum logic information, electronic oscillators, or any other technology known to those skilled in the art.

As shown in FIG. 4A the time signal 420 transmitted by the entity 410 can be, for example, radio transmissions from any number of sources including, in some aspects, an antenna located near a radio station, or a satellite.

The time signal 420 may additionally be broadcast, for example, by the entity 410 over a radio station whereby an employee of the retail store can listen to the reference time signal 420 as it is broadcast by the entity 410 and then manually calibrate the reference timekeeping product 450 to the timekeeping standard. In other aspects, the reference time signal 420 may be available over the internet such that a retail store employee may retrieve the current reference time and then use that information to manually calibrate the reference timekeeping product 450 to the timekeeping standard.

In yet another aspect, the reference time signal 420 may be made available by the entity 410 such that a retail store employee, for example, can communicate with the entity 410 by telephone or other communication device and receive the current reference time signal 420 aurally. The retail store employee can then use that reference time to manually calibrate the reference timekeeping product 450 to the timekeeping standard.

In some embodiments, the timekeeping product 450 can be an automatically-powered timekeeping device, and could be kinetically or motion-powered, solar-powered, or thermoelectrically powered.

As shown in FIG. 4A, in accordance with one aspect of the invention, the timekeeping product 450 can be an automatically-powered timekeeping device, and could, for example, include a winding mechanism that is wound by a kinetic or motion-powered mechanism. Incorporating such a timekeeping product into a retail store display 430, and maintaining it there until a potential customer purchase could result in a loss of timekeeping function due to a lack of motion to power the kinetic-powered winding mechanism. In some aspects, then, the retail store display 430 could include a maneuvering mechanism 480. The timekeeping product 450 can be coupled with the maneuvering mechanism 480 such that as long as the maneuvering mechanism is engaged, the motion derived would enable the timekeeping product 450 to maintain timekeeping function by conversion of motion into power via the kinetic-powered winding mechanism.

The maneuvering mechanism 480 can be, as an example, a rotating pedestal or holder, or any similar device known to those skilled in the art, that rotates the timekeeping product 450 in a pattern that can allow the face of the timekeeping product 450 to remain, while in operation, directed towards a retail customer. In other aspects, the maneuvering mechanism 480 can be, for example, a shaker, or other device that moves the timekeeping product 450 in a way by which the kinetic-powered winding mechanism is able to utilize the motion to produce power.

As shown in FIG. 4A, in accordance with one aspect of the invention, the timekeeping product 450 can be an automatically-powered timekeeping device, and could be, for example, a solar-powered timekeeping device. The solar-powered timekeeping device could include, in some aspects, a solar conversion panel which is capable of converting light into electrical energy to provide power to the timekeeping device, the energy being stored in some type of energy cell contained within the timekeeping device. Incorporating this type of timekeeping product into a retail store display 430, may cause a loss of timekeeping function due to an inadequacy of light supplied to the solar conversion panel, and thus, in certain embodiments of the invention, the retail store display 430 can include a lighting mechanism 490. In some cases, the timekeeping product can be positioned within the retail store display such that the solar conversion panel is exposed to light from the lighting mechanism so as to charge the energy cell contained within the timekeeping product.

The lighting mechanism 490 may be incorporated within the retail store display 430 in several different ways, as illustrated in FIG. 4B. The lighting mechanism 490 may appear, for example, on any or several surfaces of the retail store display 430, or may alternatively appear on an individual pedestal, platform, or display device on which the timekeeping product 450 has been displayed. These suggested locations for the lighting mechanism 490 are given merely as examples, and should not limit the scope of the invention in any way as would be understood to one skilled in the art. The position of the lighting mechanism 490 should be made so as to provide the solar conversion panel an adequate source of light so as to allow the energy cell to be properly charged.

The lighting mechanism 490 may include any type of light source that would provide the solar conversion panel with an adequate source of energy. The types of lighting mechanisms that could be used may include lighting that can be, but is not limited to, fluorescent, incandescent, halogen, CFL, LED, HID, solar replication, and daylight.

As shown in FIG. 4C, in accordance with one aspect of the invention, the timekeeping product 450 can be an automatically-powered timekeeping device, and could be, for example, powered by a thermo-electrically-powered mechanism. The thermo-electrically powered-mechanism could include, in some aspects, an endothermic plate for absorbing heat provided by a wearer of the timekeeping product. The thermo-electrically-powered mechanism may also include a thermoelectric conversion element which converts the absorbed heat to electricity for powering the timekeeping product. The electricity produced can, in some aspects, be stored in an energy cell contained within the timekeeping product. Incorporating such a timekeeping product into a retail store display 430, and maintaining it there until a potential customer purchase, could result in a loss of timekeeping function due to a lack of heat differential provided to the endothermic plate for electricity conversion. In some aspects, then, the retail store display 430 could include a heating mechanism 495. In some cases, the timekeeping product 450 can be positioned within the retail store display such that the endothermic plate is exposed to heat from the heating mechanism so as to provide energy to the thermoelectric conversion element for electricity conversion.

The heating mechanism 495, may include any type of heat source that would provide the endothermic plate with an adequate source of energy. The types of heating mechanisms 495 that could be used may include heat lamps; electric heating plates, which may or may not be directly coupled to the timekeeping product 450 in some embodiments; convection heaters; or radiant heating plates. The heating mechanism 495 should be of a type that provides heat to the endothermic plate but does not provide so much heat that it undesirably alters the ambient temperature of the environment within the retail store display 430. Only by maintaining a temperature differential between the endothermic plate and the ambient temperature to which the timekeeping product is exposed can the thermoelectric conversion element have the capability to use the temperature differential to convert heat energy to electricity. A convenient location for the heating mechanism 495 is directly behind the location of an individual timekeeping product, and directly facing the endothermic plate, whereby an amount of heat can be generated that provides the most energy to the endothermic plate, but may be of a small amount so as to not have much affect on the ambient temperature in the retail store display 430. It is understood that the locations provided herein are exemplary in nature, and that any element of the method of displaying a timekeeping product can have any desired location to suit any of a variety of needs.

As shown in FIG. 4A, the timekeeping product 450 can be a manually-winding-type timekeeping device. The manually-winding-type timekeeping device can include, in some embodiments, a mainspring for powering the watch, and a crown that is coupled to the mainspring whereby the crown can be turned manually in order to wind the mainspring. Manually-winding-type timekeeping devices typically should be wound on a daily or weekly basis in order to maintain proper timekeeping function. A timekeeping product 450 that is a manually-winding-type timekeeping device included in retail store display 430, which is maintained in the retail store display 430 until a customer purchase could lose proper timekeeping function over time. In some aspects, the manually-winding-type timekeeping device can be wound on a regular basis by an employee of the retail store. The retail store display 430 can include a winding time-of-day 470 at which the timekeeping product 450 was wound, in the same location as, or in a location near, the displayed known time-of-day 460 at which the timekeeping product 450 was synchronized with the reference clock 440. The winding time-of-day can include, in some aspects, a daily time-of-day at which the manually-winding-type timekeeping device is wound, an indication of the regular basis on which the manually-winding-type timekeeping device is wound, or any other information such that a retail store customer can determine visually how the manually-winding-type timekeeping device is wound so as to maintain proper timekeeping function.

In accordance with another aspect of the invention, the retail store display 430 can include a maneuvering mechanism 480 that is capable of being coupled with the crown so as to automatically wind the manually-winding-type timekeeping device. This maneuvering mechanism can be a device such as, or similar to, the Sempre model manual watch winder produced by Orbita.

Figure 5:
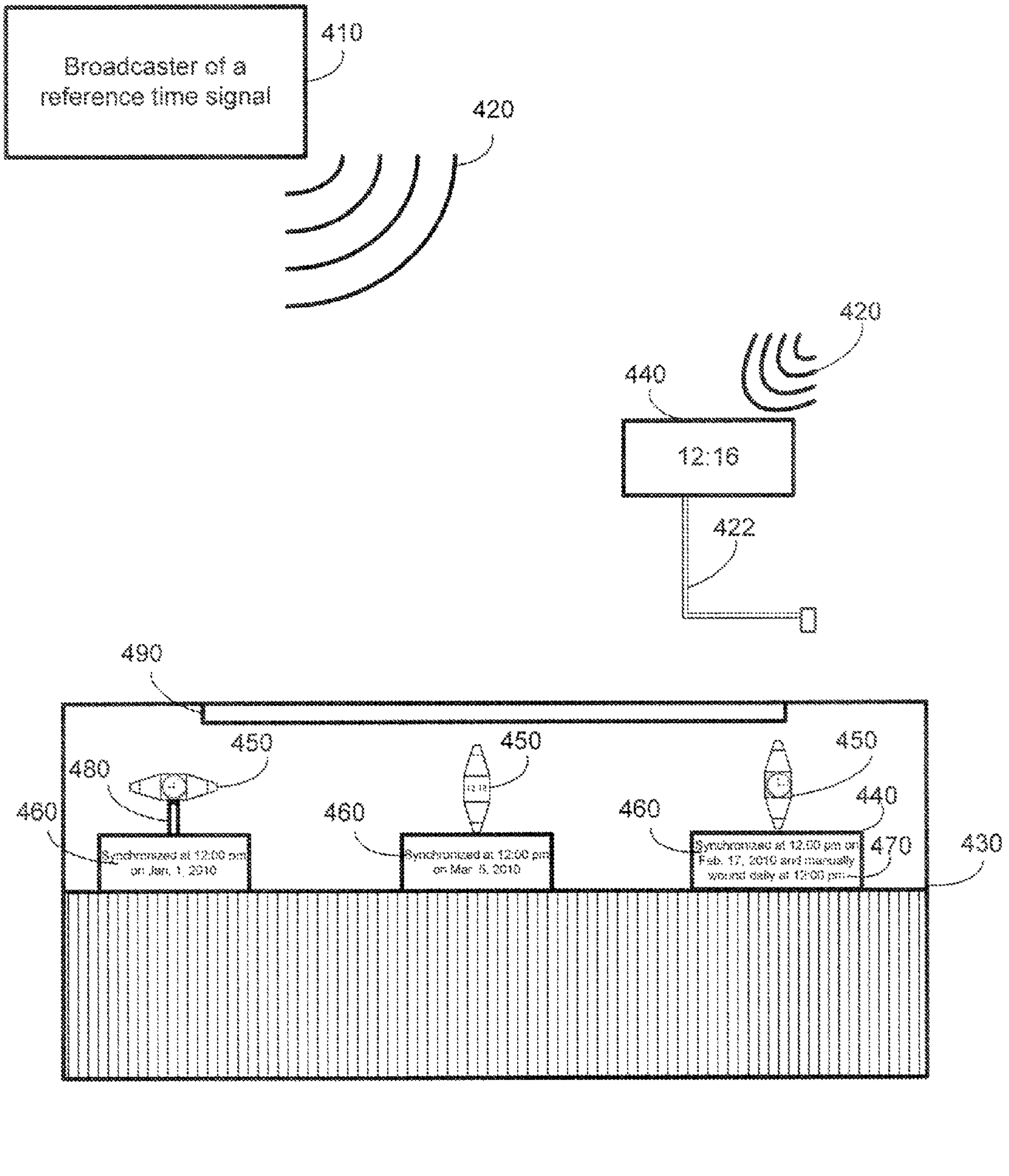
FIG. 5 illustrates a retail store display for displaying a timekeeping product according to embodiments of the present invention.

As shown in FIG. 5, in accordance with one aspect of the invention, the reference timekeeping product 440 can be, for example, communicatively coupled 422 to a network whereby the reference timekeeping product 440 can additionally maintain a reference time based on a time protocol transmitted across the network.

In accordance with yet another aspect of the invention, as shown in FIG. 5, the reference timekeeping product 440 may be located outside of the retail store display. The reference timekeeping product 440 should, for example, be located in a position whereby a retail customer can visually identify the reference time displayed on the reference timekeeping product 440 so as to be able to determine whether the time displayed by the timekeeping product 450 has deviated in some fashion from the standard time displayed by the reference timekeeping product.

The preceding description has been presented only to illustrate and describe exemplary embodiments of the methods and systems of the present invention. It is not intended to be exhaustive or to limit the invention to any precise form disclosed. The foregoing embodiments are illustrative, and no single feature or element is essential to all possible combinations that may be claimed in this or a later application. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention. The invention may be practiced otherwise than is specifically explained and illustrated without departing from its spirit or scope. This description of the invention should be understood to include all novel and non-obvious combinations of elements described herein, and claims may be presented in a later application to any novel and non-obvious combination of these elements.

As used herein and in the appended claims, the singular forms "a", "an", and "the" include plural references unless the context clearly dictates otherwise. Thus, for example, reference to "a process" includes a plurality of such processes, and reference to "the energy cell" includes reference to one or more energy cells and equivalents thereof known to those skilled in the art, and so forth.

Also, the words "comprise", "comprising", "include", "including", and "includes", when used in this specification and in the following claims, are intended to specify the presence of stated features, integers, components, or steps, but they do not preclude the presence or addition of one or more other features, integers, components, steps, acts, or groups.

What is claimed is:

1. A method for displaying a timekeeping product in a retail store display comprising:

receiving, at a retail store, a reference time signal broadcast from a national measurement standards laboratory;

continuously calibrating, at the retail store, a reference clock using the reference time signal, so that the reference clock displays a standard time-of-day as maintained by the national measurement standards laboratory;

synchronizing, at a known time-of-day, the timekeeping product with the reference clock;

displaying, within the retail store display, the known time-of-day at which the timekeeping product was synchronized with the reference clock;

placing the synchronized timekeeping product, and the continuously calibrated reference clock, within the retail store display so that a product time-of-day displayed by the synchronized timekeeping product, and the standard time-of-day displayed by the reference clock, are visible to a retail customer at the retail store in a way by which the retail customer can visually identify a discrepancy or a lack thereof between the displayed product time-of-day of the timekeeping product and the displayed standard time-of-day of the reference clock.

2. The method of claim 1, wherein the timekeeping product in the retail store display comprises a member selected from the group consisting of an analog timekeeping device, a digital timekeeping device, a battery-powered timekeeping device, a manually-winding-type timekeeping device, an automatically-powered timekeeping device, and a timekeeping device powered by a combination of automatic power and battery power.

3. The method of claim 1, wherein the timekeeping product is an automatically-powered timekeeping device, wherein the automatically-powered timekeeping device comprises a kinetic-powered winding mechanism, wherein the retail store display includes a maneuvering mechanism, and wherein the automatically-powered timekeeping device is coupled with the maneuvering mechanism, such that the movement of the maneuvering mechanism operates to wind the kinetic-powered winding mechanism.

4. The method of claim 1, wherein the timekeeping product is an automatically-powered timekeeping device, wherein the automatically-powered timekeeping device comprises a solar conversion panel and energy cell, wherein the retail store display includes a lighting mechanism, and wherein the timekeeping product is positioned in the retail store display such that the solar conversion panel is exposed to light from the lighting mechanism so as to charge the energy cell of the timekeeping product.

5. The method of claim 1, wherein the timekeeping product requires manual winding, and wherein the retail store display includes, in the same location as the displayed known time-of-day, an indication of a winding time-of-day at which the timekeeping product was wound.

6. A method for displaying a timekeeping product in a retail store display comprising:

synchronizing the timekeeping product with a reference timekeeping product at a known time and date, wherein the reference timekeeping product is continuously calibrated to a time and frequency standard that is received via a transmission;

incorporating the synchronized timekeeping product into the retail store display;

identifying, within the retail store display, the known time and date on which the timekeeping product was synchronized with the reference timekeeping product;

locating the reference timekeeping product near the retail store display so that a retail store customer can visually identify a discrepancy in timekeeping accuracy between the timekeeping product and the reference timekeeping product.

7. The method of claim 6, wherein the timekeeping product in the retail store display comprises a member selected from the group of an analog timekeeping device, a digital timekeeping device, a battery-powered timekeeping device, a manually-winding-type timekeeping device, an automatically-powered timekeeping device, and a timekeeping device powered by a combination of automatic power and battery power.

8. The method of claim 7, wherein the automatically-powered timekeeping device is selected from the group consisting of a kinetic-powered timekeeping device, a solar-powered timekeeping device, and a thermo-electrically-powered timekeeping device.

9. The method of claim 8, wherein the automatically-powered timekeeping device is a kinetic-powered timekeeping device, wherein the kinetic-powered timekeeping device comprises a kinetic-powered winding mechanism, wherein the retail store display includes a maneuvering mechanism, and wherein the kinetic-powered timekeeping device is coupled with the maneuvering mechanism, such that the movement of the maneuvering mechanism operates to wind the kinetic-powered winding mechanism.

10. The method of claim 9, wherein the maneuvering mechanism is a rotating pedestal.

11. The method of claim 8, wherein the automatically-powered timekeeping device is a solar-powered timekeeping device, wherein the solar-powered timekeeping device comprises a solar conversion panel and energy cell, wherein the retail store display includes a lighting mechanism, and wherein the solar-powered timekeeping device is positioned in the retail store display such that the solar conversion panel is exposed to light from the lighting mechanism so as to charge the energy cell of the solar-powered timekeeping device.

12. The method of claim 8, wherein the automatically-powered timekeeping device is a thermo-electrically-powered timekeeping device having an endothermic plate, a thermoelectric conversion mechanism, and an energy cell, wherein the retail store display includes a heating mechanism, and wherein the thermo-electrically-powered timekeeping device is positioned in the retail store display such that the endothermic plate is exposed to heat from the heating mechanism so as to charge the energy cell of the thermo-electrically-powered timekeeping device with electricity produced by the thermoelectric conversion mechanism in response to the heat.

13. The method of claim 7 wherein the timekeeping product is a manually-winding-type timekeeping device, and wherein the retail store display includes, in the same location as the known time and date, an indication of a winding time-of-day at which the manually-winding-type timekeeping product is wound.

14. The method of claim 6 wherein the reference timekeeping product is calibrated via a signal received from a broadcast from a national measurement standards laboratory.

15. A method for displaying a timekeeping product in a retail store display comprising:

displaying a reference timekeeping product in the retail store display, wherein the reference timekeeping product is calibrated to a timekeeping standard received from a broadcasted signal;

using the reference timekeeping product to synchronize the timekeeping product;

displaying the timekeeping product in the retail store display with the reference timekeeping product whereby a retail customer can visually compare a time displayed by the timekeeping product against a time displayed by the reference timekeeping product.

16. The method of claim 15 wherein the retail store display includes a displayed time and date on which the timekeeping product was synchronized with the reference timekeeping product.

17. The method of claim 15 wherein the timekeeping product in the retail store display comprises a member selected from the group of an analog timekeeping device, a digital timekeeping device, a battery-powered timekeeping device, a manually-winding-type timekeeping device, an automatically-powered timekeeping device, and a timekeeping device powered by a combination of automatic power and battery power.

18. The method of claim 17 wherein the automatically-powered timekeeping device is selected from the group consisting of a kinetic-powered timekeeping device, a solar-powered timekeeping device, and a thermo-electrically-powered timekeeping device.

19. The method of claim 18 wherein the automatically-powered timekeeping device is a kinetic-powered timekeeping device, wherein the kinetic-powered timekeeping device comprises a kinetic-powered winding mechanism, wherein the retail store display includes a maneuvering mechanism, and wherein the kinetic-powered timekeeping device is coupled with the maneuvering mechanism, such that the movement of the maneuvering mechanism operates to wind the kinetic-powered winding mechanism.

20. The method of claim 18 wherein the automatically-powered timekeeping device is a solar-powered timekeeping device, wherein the solar-powered timekeeping device comprises a solar conversion panel and energy cell, wherein the retail store display includes a lighting mechanism, and wherein the solar-powered timekeeping device is positioned in the retail store display such that the solar conversion panel is exposed to light from the lighting mechanism so as to charge the energy cell of the solar-powered timekeeping device.

* * * * *